United States Patent
Skala et al.

(10) Patent No.: US 7,687,174 B2
(45) Date of Patent: Mar. 30, 2010

(54) OPTICAL FUEL CELL STACK CELL VOLTAGE MONITOR

(75) Inventors: Glenn W. Skala, Churchville, NY (US); Robert S. Foley, Rochester, NY (US)

(73) Assignee: GM Global Technology Operations, Inc., Detroit, MI (US)

( * ) Notice: Subject to any disclaimer, the term of this patent is extended or adjusted under 35 U.S.C. 154(b) by 1030 days.

(21) Appl. No.: 11/396,487

(22) Filed: Apr. 4, 2006

(65) Prior Publication Data

US 2007/0231641 A1    Oct. 4, 2007

(51) Int. Cl.
H01M 8/10 (2006.01)
G01R 31/02 (2006.01)
G01R 31/08 (2006.01)

(52) U.S. Cl. .......................... 429/30; 429/32; 324/522; 324/537; 324/757; 324/763

(58) Field of Classification Search ................ 324/501
See application file for complete search history.

(56) References Cited

U.S. PATENT DOCUMENTS 4,338,627 A * 7/1982 Stapleton ................ 348/164

FOREIGN PATENT DOCUMENTS

JP    2005141936 A * 6/2005

* cited by examiner

*Primary Examiner*—Jerry Lorengo
*Assistant Examiner*—Jared Wood
(74) *Attorney, Agent, or Firm*—John A. Miller; Miller IP Group, PLC

(57) ABSTRACT

A voltage monitoring system for measuring the voltage of the fuel cells in a fuel cell stack that employs optical devices for providing an optical signal of the measured voltages, where one or more of the fuel cells power the optical devices. A surface mount device is electrically coupled to opposing plates in the stack, or opposing plates over a plurality of cells in the stack. The surface mount device includes a bonded contact and a spring contact to provide the electrical connection. A detector is positioned remote from the stack that receives the optical signals and converts them back to electrical signals indicative of the voltage.

17 Claims, 2 Drawing Sheets

OPTICAL FUEL CELL STACK CELL VOLTAGE MONITOR

BACKGROUND OF THE INVENTION

1. Field of the Invention

This invention relates generally to a voltage monitoring system for a fuel cell stack and, more particularly, to a voltage monitoring system for a fuel cell stack that employs optical devices for providing an optical signal indicative of the voltage of each fuel cell in the fuel cell stack.

2. Discussion of the Related Art

Hydrogen is a very attractive fuel because it is clean and can be used to efficiently produce electricity in a fuel cell. A hydrogen fuel cell is an electrochemical device that includes an anode and a cathode with an electrolyte therebetween. The anode receives hydrogen gas and the cathode receives oxygen or air. The hydrogen gas is dissociated in the anode to generate free hydrogen protons and electrons. The hydrogen protons pass through the electrolyte to the cathode. The hydrogen protons react with the oxygen and the electrons in the cathode to generate water. The electrons from the anode cannot pass through the electrolyte, and thus are directed through a load to perform work before being sent to the cathode.

Proton exchange membrane fuel cells (PEMFC) are a popular fuel cell for vehicles. The PEMFC generally includes a solid polymer electrolyte proton conducting membrane, such as a perfluorosulfonic acid membrane. The anode and cathode typically include finely divided catalytic particles, usually platinum (Pt), supported on carbon particles and mixed with an ionomer. The catalytic mixture is deposited on opposing sides of the membrane. The combination of the anode catalytic mixture, the cathode catalytic mixture and the membrane define a membrane electrode assembly (MEA). MEAs are relatively expensive to manufacture and require certain conditions for effective operation.

Several fuel cells are typically combined in a fuel cell stack to generate the desired power. For example, a typical fuel cell stack for a vehicle may have two hundred or more stacked fuel cells. The fuel cell stack receives a cathode input gas, typically a flow of air forced through the stack by a compressor. Not all of the oxygen is consumed by the stack and some of the air is output as a cathode exhaust gas that may include water as a stack by-product. The fuel cell stack also receives an anode hydrogen input gas that flows into the anode side of the stack.

The fuel cell stack includes a series of bipolar plates positioned between the several MEAs in the stack. The bipolar plates include an anode side and a cathode side for adjacent fuel cells in the stack. Anode gas flow channels are provided on the anode side of the bipolar plates that allow the anode reactant gas to flow to the respective MEA. Cathode gas flow channels are provided on the cathode side of the bipolar plates that allow the cathode reactant gas to flow to the respective MEA. The bipolar plates are made of an electrically conductive material, such as stainless steel, so that they conduct the electricity generated by the fuel cells out of the stack. The bipolar plates also include flow channels through which a cooling fluid flows.

Typically, the voltage output of every fuel cell in the fuel cell stack is monitored so that the system knows if a fuel cell voltage is too low, indicating a possible failure. As is understood in the art, because all of the fuel cells are electrically coupled in series, if one fuel cell in the stack fails, then the entire stack will fail. Certain remedial actions can be taken for a failing fuel cell as a temporary solution until the fuel cell vehicle can be serviced, such as increasing the flow of hydrogen and/or increasing the cathode stoichiometry.

The fuel cell voltages are measured by a cell voltage monitoring sub-system that includes a wire connected to each bipolar plate in the stack and end plates of the stack to measure a voltage potential between the positive and negative sides of each cell. Therefore, a 400 cell stack will include 401 wires connected to the stack. Because of the size of the parts, the tolerances of the parts, the number of the parts, etc., it may be impractical to provide a physical connection to every bipolar plate in a stack with this many fuel cells.

SUMMARY OF THE INVENTION

In accordance with the teachings of the present invention, a voltage monitoring system for measuring the voltage of the fuel cells in a fuel cell stack is disclosed that employs optical devices for providing an optical signal of the measured voltages, where the voltage provides the power to operate the optical devices. A surface mount device is electrically coupled to opposing plates in the stack, or opposing plates over a plurality of fuel cells in the stack. The surface mount device includes a bonded contact and a spring contact to provide the electrical connection. The surface mount device also includes a circuit for measuring the voltage of the cell or cells, which is transmitted as an optical signal by the optical device. A detector is positioned remote from the stack that receives the optical signals and converts them back to electrical signals indicative of the voltage. If a single optical device is provided for more than one fuel cell, then the circuit can scan the fuel cells where an optical signal from one of the fuel cells is being provided at any particular point in time.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a voltage monitoring system that includes an optical device for providing an optical signal indicative of the voltage of the fuel cells in a fuel cell stack is merely exemplary in nature, and is in no way intended to limit the invention or its applications or uses.

Figure 1:
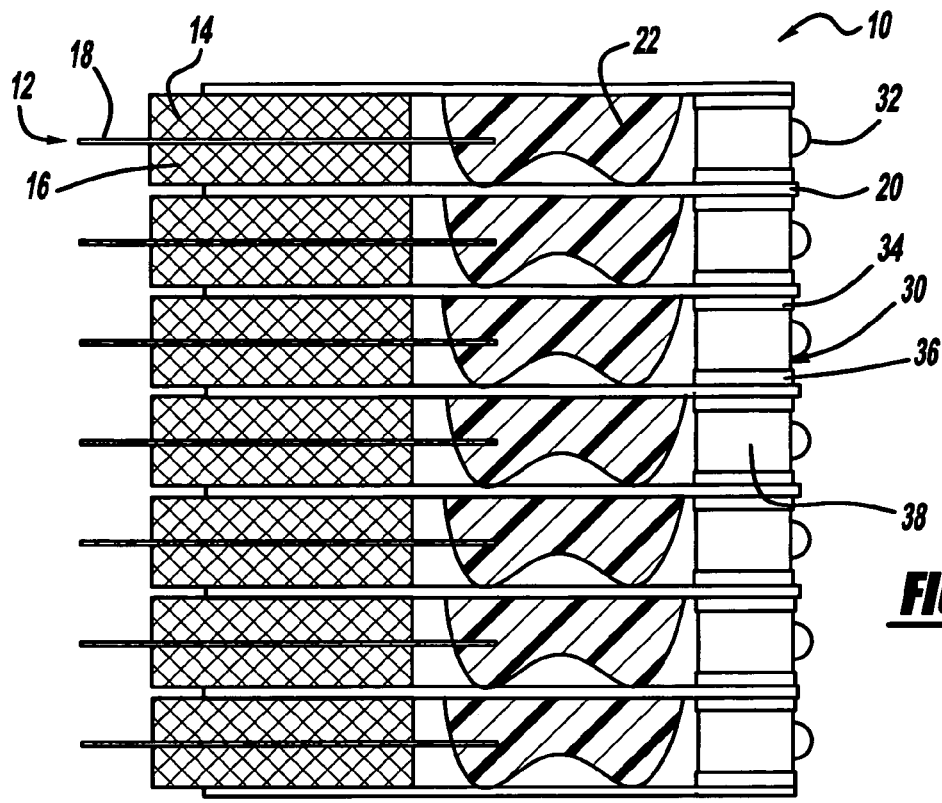
FIG. 1 is a plan view of a plurality fuel cells in a fuel cell stack that includes a separate optical device for providing an optical signal indicative of the voltage of each fuel cell in the stack, according to an embodiment of the present invention.

FIG. 1 is a plan view of a fuel cell stack 10 including a plurality of fuel cells 12, according to an embodiment of the present invention. Each fuel cell 12 includes an anode side diffusion media layer 14, a cathode side diffusion media layer 16 and a membrane 18 therebetween. A bipolar plate 20 is provided at each side of each fuel cell 12, where the side of the bipolar plate 20 facing the anode side diffusion media layer 14 includes anode side reactant gas flow channels (not shown) and the side of the bipolar plate 20 facing an adjacent fuel cell 12 includes cathode reactant gas flow channels (not shown). Further, the bipolar plates 20 include cooling fluid flow channels (not shown). Also, a resilient seal 22 is provided at an outer edge of each fuel cell 12 to contain the various fluids within the stack 10.

As discussed above, typically the voltage of each fuel cell 12 in the fuel cell stack 10 is monitored by electrically coupling a wire to each bipolar plate 20, and using appropriate circuitry to measure the voltage potential across the plates 20. According to the invention, the voltage of each fuel cell 12 is measured by a surface mounted device (SMD) 30 including an optical device 32, such as a light emitting diode (LED). The SMDs 30 would be sized appropriately to fit in the gap between the bipolar plates 20 without causing the bipolar plates 20 of each fuel cell 12 to bend. The SMD 30 includes a bonded contact 34 electrically coupled to one bipolar plate 20 and a spring contact 36 electrically coupled to an opposing bipolar plate 20 so that the device 30 makes good electrical contact with the opposing bipolar plates 20 for each fuel cell 12. The bonded contact 34 can be mounted to the bipolar plate 20 by any suitable technique, such as adhesive, soldering, welding, etc. The spring contact 36 would provide an electrical contact so that when the stack 10 is assembled and compressed, a complete circuit would be provided across the bipolar plates 20. The spring contact 36 provides a good electrical contact while satisfying the variance in tolerances between the bipolar plates 20.

The SMD 30 includes a circuit 38 that measures the voltage potential between the plates 20. The voltage of the fuel cell 12 is used to power the LEDs 32 to generate an optical signal. Those skilled in the art would readily recognize various circuits that could measure the voltage potential of the fuel cells 12, and provide an optical signal indicative of the voltage potential. Therefore, as the voltage output of a particular fuel cell 12 changes, the optical signal from the LED 32 would change accordingly. Many techniques exist in the art where the optical signal from the LED 32 can provide an indication of the voltage potential. For example, in an analog version, the intensity of the light from the LED 32 can be an indication of the voltage potential, where the optical signal is proportional to the voltage. The circuit 38 may include a voltage regulator and/or other circuitry to convert the voltage to a level usable by the LED 32. Also, the circuit 38 can generate a digital optical signal that is frequency modulated, for example, to encode the voltage. The SMDs 30 could be aligned along the edge of the stack 10, as shown, or could be staggered along the edge of the stack 10 to provide separation to allow each plate to bend and maintain electrical contact.

Most LEDs have a minimum forward voltage of about 1.2 volts rendering them impractical for measuring a single cell voltage. Thus, the circuit 38 could include a miniature booster converter to amplify the measured voltage. The booster converters feedback loop could be designed to have its output current follow the input voltage, allowing the intensity of the LED 32 to vary with cell voltage.

Figure 2:
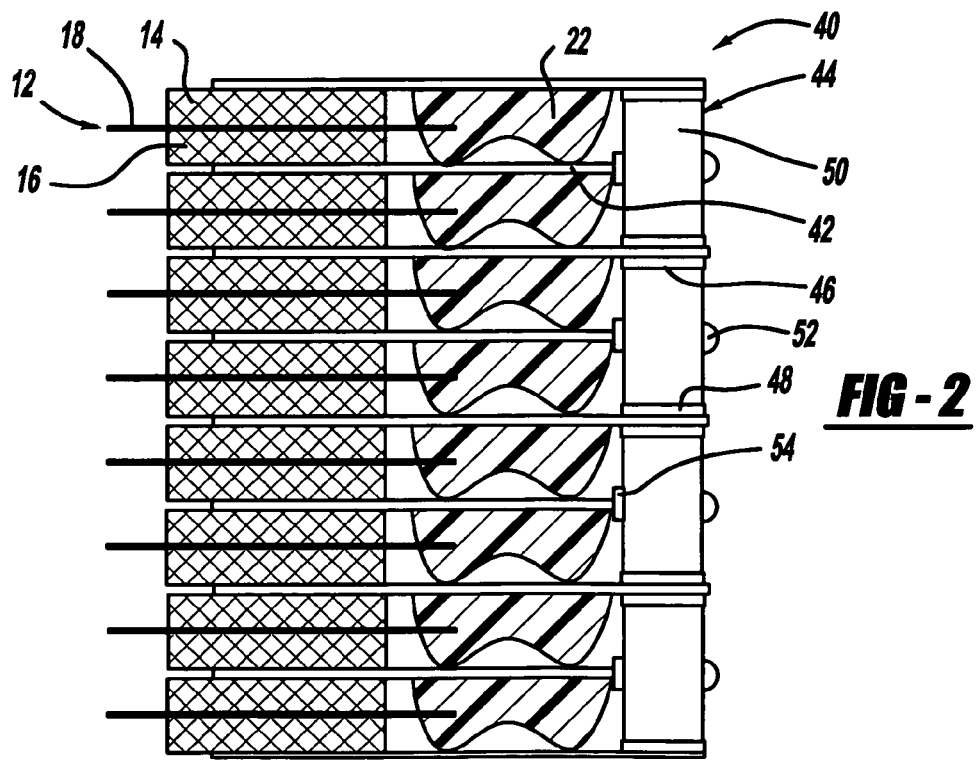
FIG. 2 is a plan view of a plurality of fuel cells in a fuel cell stack that includes an optical device for providing an optical signal indicative of the voltage of each fuel cell in the stack, where a single optical device provides an optical signal for a plurality of the fuel cells, according to another embodiment of the present invention.

FIG. 2 is a plan view of a fuel cell stack 40, similar to the fuel cell stack 10, where like elements are identified by the same reference numeral, according to another embodiment of the present invention. In this embodiment, every other bipolar plate 20 includes a notch to provide a notched plate 42. Additionally, the SMDs 30 are replaced with SMDs 44 that span the height of two fuel cells 12, where the notch in the bipolar plates 42 provides the space for the SMD 44. Each SMD 44 includes an LED 52, a bonded contact 46, a spring contact 48 and a circuit 50. Additionally, the SMDs 44 include a spring contact 54 in electrical contact with the notched bipolar plate 42, as shown, so that the voltage of the fuel cells 12 covered by a single SMD 44 can be separately measured. In other embodiments, the spring contacts 54 could be rigid contacts. The circuit 50 would be designed so that it selectively measures the voltage potential across one fuel cell 12 and then the other fuel cell.

If the spring contact 54 for the notched plate 42 was eliminated, then the SMD 44 would measure the voltage potential across two of the fuel cells 12. Thus, if either cell failed, the optical signal from the LED 52 would indicate that one of the cells has failed and there is a potential problem. Thus, a single SMD can be used to measure the voltage potential of more than one fuel cell. In other embodiments, more notched plates can be provided so that the number of fuel cells 12 that the SMD is monitoring can be more.

A detector would be required to detect the optical signals from the LEDs 32 and 52. There are many different techniques for designing such a detector. For example, the detector could be mounted facing the array of SMDs and detect the optical signal from all of the LEDs 32 or 52 at one time. Alternately, the optical signals could pass through various optics, such as mirrors, fiber optics, prisms, etc. so that the light intensity of each LED can be sensed remotely, away from the edge of the bipolar plates 20. Further, one or more micro-mirrors, such as those used in DLP projectors, coupled with optics could be provided so that one single element detector could be used, where the mirror is used to scan the optical signals. Further, a charge coupled device (CCD) could be used to sense the optical signals.

Figure 3:
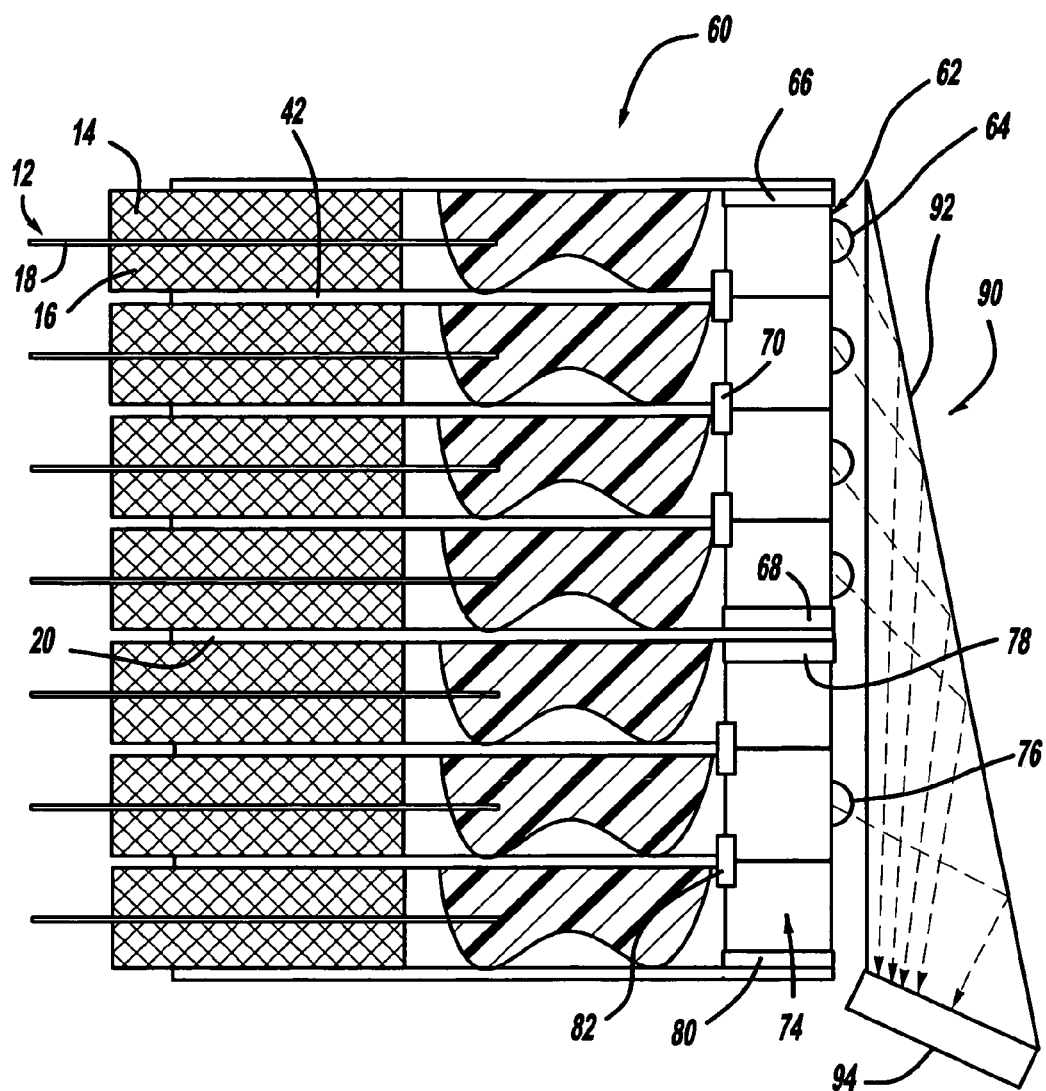
FIG. 3 is a plan view of a plurality of fuel cells in a fuel cell stack that includes a voltage monitoring system that measures the voltage of each fuel cell in the fuel cell stack and transmits an optical signal indicative of the measured voltage, according to an another embodiment of the present invention.

FIG. 3 is a plan view of a fuel cell stack 60 similar to the fuel cell stacks 10 and 40, where like elements are identified by the same reference numeral. FIG. 3 illustrates two embodiments for measuring the voltage of the fuel cells 12. In one embodiment, a series of SMDs 62 are electrically coupled together, where each SMD 62 includes an LED 64. The series of SMDs 62 extend across several fuel cells 12 and notched plates 42. A bonded contact 66 is provided at one end of the series of SMDs 62 and a spring contact 68 is provided at the other end of the series of SMDs 62. Additionally, a spring contact 70 is provided in contact with the SMDs 62 and the notched bipolar plates 42, as shown. Thus, a separate LED 64 is provided for each fuel cell 12 to provide an optical signal of its voltage output.

In the other embodiment, the fuel cell stack 10 includes a series of SMDs 74 having a single LED 76, and is similar to the SMD 44. The series of SMDs 70 include a bonded contact 78 electrically coupled to one bipolar plate 20, a spring contact 80 electrically coupled to another bipolar plate 20, and spring contacts 82 electrically coupled to notched bipolar plates 42 therebetween.

A detector 90 is provided to detect the optical beams from the LEDs 66 and 72. The detector 90 includes a mirror 92 and a CCD array 94. Optical beams from the LEDs 64 that are proportional to the voltage of single fuel cells 12 are reflected off of the mirror 92 and directed to a particular pixel or group of pixels on the CCD array 94. The CCD array 94 converts the light intensity to an electrical signal that is processed to convert it to a cell voltage. The SMDs 74 are designed so that circuitry therein directs the voltage potential sequentially from the fuel cells 12 to the LED 76, which then directs the optical beam to a pixel or group of pixels on the CCD array 94. Therefore, at any given moment in time, any one of the fuel cells 12 being detected by the SMDs 74 will be output from the CCD array 94. The number of cells that power each SMD can vary depending on what voltage is required to power such a device and the expected range of voltage produced by the cells.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A fuel cell stack comprising:
a stack of fuel cells;
a plurality of spaced apart bipolar plates separating the fuel cells in the fuel cell stack; and
at least one voltage monitoring circuit positioned between and in electrical contact with opposing bipolar plates, said at least one voltage monitoring circuit including an optical device that is powered by one or more of the fuel cells, said at least one voltage monitoring circuit including a first contact electrically coupled to one bipolar plate and a second contact electrically coupled to an opposing bipolar plate where the first contact is a bonded contact and the second contact is a spring contact, wherein the voltage monitoring circuit measures the voltage of at least one of the fuel cells and the optical device emits an optical signal indicative of the measured voltage.

2. The stack according to claim 1 wherein the at least one voltage monitoring circuit is a surface mount device.

3. The stack according to claim 1 wherein the optical device is an LED.

4. The stack according to claim 1 wherein the at least one voltage monitoring circuit measures the voltage of a plurality of adjacent fuel cells, where a separate contact is electrically coupled to each bipolar plate in the series of fuel cells.

5. The stack according to claim 1 wherein the at least one voltage monitoring circuit is a plurality of voltage circuits where a separate voltage monitoring circuit monitors the voltage of each fuel cell.

6. The stack according to claim 1 wherein the at least one voltage monitoring circuit is a plurality of voltage monitoring circuits, where one voltage monitoring circuit monitors the voltage of more than one fuel cell.

7. The stack according to claim 6 wherein the plurality of voltage monitoring circuits include a single optical device, where the single optical device outputs a voltage from the fuel cells sequentially.

8. The stack according to claim 1 further comprising a detector for detecting the optical signal.

9. The stack according to claim 8 wherein the detector includes a mirror for reflecting the optical signal.

10. The stack according to claim 8 wherein the detector includes a charge coupled device array that receives the optical signal and converts it to an electrical signal.

11. A fuel cell stack comprising:
a stack of fuel cells;
a plurality of spaced apart bipolar plates separating the fuel cells in the fuel cell stack;
a plurality of voltage monitoring circuits positioned between and in electrical contact with opposing bipolar plates, said voltage monitoring circuits including one or more optical devices that are powered by one or more of the fuel cells, each voltage monitoring circuit including a first contact electrically coupled to one bipolar plate and a second contact electrically coupled to an opposing bipolar plate where the first contact is a bonded contact and the second contact is a spring contact, wherein the voltage monitoring circuits measure the voltage of the fuel cells and the one or more optical devices emit an optical signal indicative of the measured voltage; and
a detector for detecting the optical signals.

12. The stack according to claim 11 wherein the plurality of voltage monitoring circuits monitor the voltage of more than one fuel cell.

13. The stack according to claim 11 wherein the plurality of voltage monitoring circuits include a single optical device, where the single optical device outputs a voltage from the fuel cells sequentially.

14. The stack according to claim 11 wherein the plurality of voltage monitoring circuits are surface mount devices.

15. The stack according to claim 11 wherein the optical devices are LEDs.

16. The stack according to claim 11 wherein the detector includes a charge coupled device array that receives the optical signal and converts it to an electrical signal.

17. A fuel cell comprising opposing electrical plates, a voltage measuring circuit electrically coupled to the plates and an optical device, said voltage measuring circuit measuring the voltage of the fuel cell and said optical device emitting an optical signal representative of the measured voltage, wherein the optical device is powered by the fuel cell, and wherein the voltage measuring circuit includes a bonded contact electrically coupled to one plate and a spring contact electrically coupled to the other plate.

* * * * *